(12) United States Patent  (10) Patent No.: US 7,405,589 B2
Lewis et al.  (45) Date of Patent: Jul. 29, 2008

(54) APPARATUS AND METHODS FOR POWER MANAGEMENT IN INTEGRATED CIRCUITS

(75) Inventors: David Lewis, Toronto (CA); Christopher F. Lane, San Jose, CA (US); Sarathy Sribhashyam, San Jose, CA (US); Srinivas Perisetty, Santa Clara, CA (US); Tim Vanderhoek, Toronto (CA); Vaughn Betz, Toronto (CA); Thomas Yau-Tsun Wong, Markham (CA); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 154 days.

(21) Appl. No.: 11/316,390

(22) Filed: Dec. 22, 2005

(65) Prior Publication Data

US 2007/0040576 A1  Feb. 22, 2007

Related U.S. Application Data

(63) Continuation-in-part of application No. 11/204,570, filed on Aug. 16, 2005, and a continuation-in-part of application No. 10/865,402, filed on Jun. 10, 2004, now Pat. No. 7,129,745.

(51) Int. Cl.
 *H03K 19/173* (2006.01)
(52) U.S. Cl. ........................................ 326/38; 327/534
(58) Field of Classification Search ............. 326/37–41; 327/534, 535
See application file for complete search history.

(56) References Cited

U.S. PATENT DOCUMENTS

| | | | |
|---|---|---|---|
| 6,621,325 B2 * | 9/2003 | Hart et al. ................... 327/534 |
| 6,710,621 B2 * | 3/2004 | Devlin et al. ................... 326/38 |
| 7,196,940 B1 * | 3/2007 | Vadi et al. .............. 365/189.02 |
| 7,227,383 B2 * | 6/2007 | Hoberman et al. ............ 326/93 |
| 7,265,605 B1 * | 9/2007 | Vasudevan ................... 327/534 |

* cited by examiner

*Primary Examiner*—Don P Le
(74) *Attorney, Agent, or Firm*—Law Offices of Maximilian R. Peterson

(57) ABSTRACT

A programmable logic device (PLD) includes a non-volatile memory, a configuration memory, and a control circuitry. The control circuitry couples to the non-volatile memory and to the configuration memory. A set of voltages are derived from the outputs of the control circuitry, and are applied to circuitry within the PLD.

23 Claims, 12 Drawing Sheets

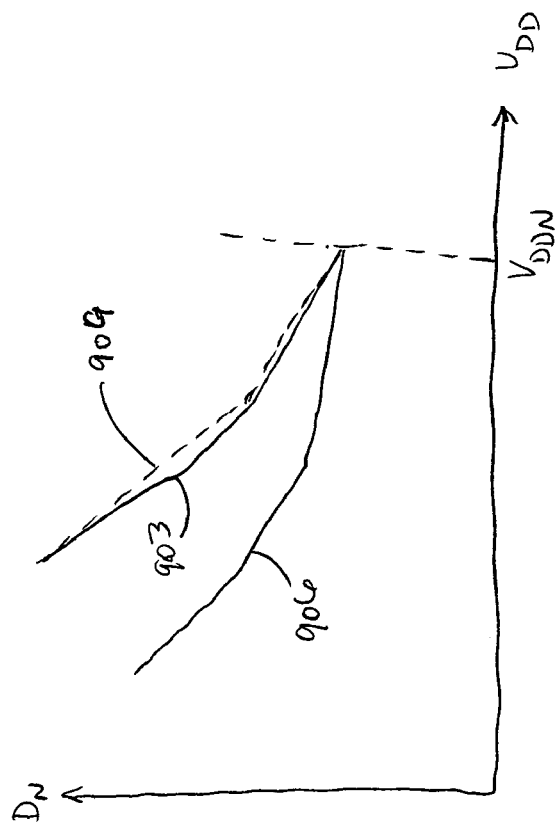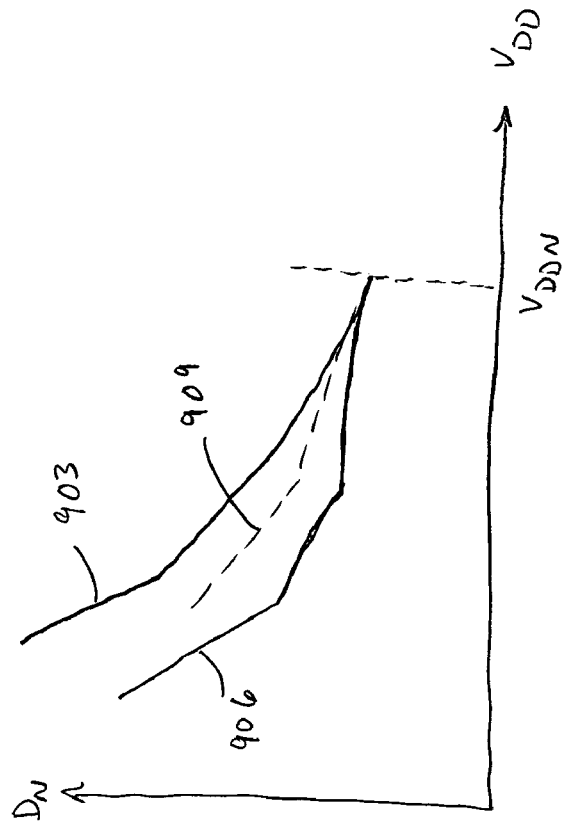

APPARATUS AND METHODS FOR POWER MANAGEMENT IN INTEGRATED CIRCUITS

CROSS-REFERENCE TO RELATED APPLICATIONS

This application is a continuation-in-part of, and incorporates by reference, U.S. patent application Ser. No. 11/204,570, titled "Apparatus and Methods for Optimizing the Performance of Programmable Logic Devices," filed on Aug. 16, 2005; and U.S. patent application Ser. No. 10/865,402, titled "Apparatus and Methods for Adjusting Performance of Integrated Circuits," filed on Jun. 10, 2004 now U.S. Pat. No. 7,129,745.

TECHNICAL FIELD

The inventive concepts relate generally to power management of integrated circuits (ICs). More particularly, the invention concerns managing power consumption or dissipation in programmable logic device (PLDs) by using user-configurable and die-specific controls or parameters.

BACKGROUND

Modern ICs, including PLDs, have undergone a high level of increase in complexity. The increased complexity of the devices has resulted in improved performance levels and increased flexibility. As a consequence, the end-user has enjoyed a level of performance.

On the other hand, the complexity and the sheer number of transistors has resulted in increased power consumption in the device. The increased power consumption results in higher device operating temperature and elevated die power densities. Those factors have given rise to challenges in device and system thermal management, reliability problems, and the like. A need therefore exists for managing the power consumption or dissipation in ICs, such as PLDs.

SUMMARY

The disclosed novel concepts relate to apparatus and methods for managing power consumption or dissipation of ICs, such as PLDs. In one exemplary embodiment, a PLD includes a non-volatile memory (NVM), a configuration memory, and a control circuit. The control circuit is coupled to the non-volatile memory and to the configuration memory. A set of voltages are derived from outputs of the control circuit, and are applied to circuitry within the PLD.

In another exemplary embodiment, a PLD includes a set of circuits configured to allow measuring delay characteristics of circuitry within the PLD. Power consumption of the PLD is optimized by using a model derived from the delay characteristics measured using the set of circuits.

In a further illustrative embodiment, a method of generating a set of values used to manage power consumption of a PLD includes generating a set of points corresponding to process variations of the PLD. For each point in the set of points, the method further includes determining a set of voltages to be applied to the programmable logic device at that point in order to minimize power consumption of the programmable logic device.

In yet another illustrative embodiment, a method of managing power consumption of an IC includes assigning all regions in a set of circuit regions in a design of the IC as high speed regions. The method also includes assigning selectively a subset of regions in the set of circuit regions as low speed regions, and reverting the assignment of the subset of regions to high speed regions depending on whether a timing specification is met.

BRIEF DESCRIPTION OF THE DRAWINGS

The appended drawings illustrate only exemplary embodiments of the invention and therefore should not be considered or construed as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

FIGS. 12A-12B depict graphs of normalized delay that correspond to power consumption management techniques according to exemplary embodiments of the invention.

DETAILED DESCRIPTION

The inventive concepts contemplate apparatus and associated methods for managing the power consumption of ICs, including PLDs. The inventive techniques use a combination of end-user configurable and die-specific parameters or controls in order to manage the power consumption or dissipation.

Figure 1:
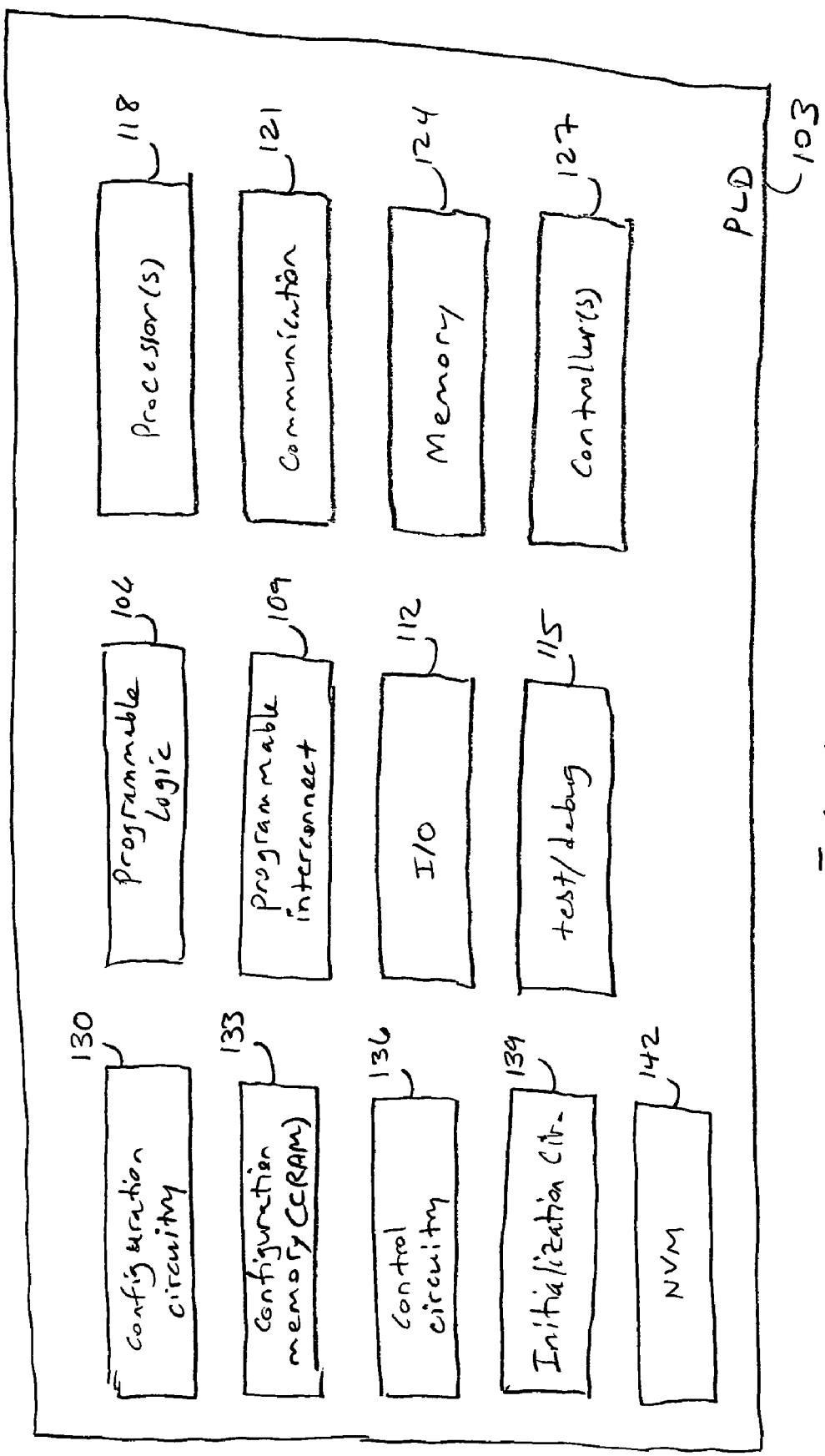
FIG. 1 shows a general block diagram of a PLD according to an illustrative embodiment of the invention.

FIG. 1 shows a general block diagram of a PLD 103 according to an illustrative embodiment of the invention. PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired. PLD 103 further includes initialization circuitry 139 and non-volatile memory or storage (NVM) 142, as described below in detail.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103, including aspects of the inventive concepts. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 2:
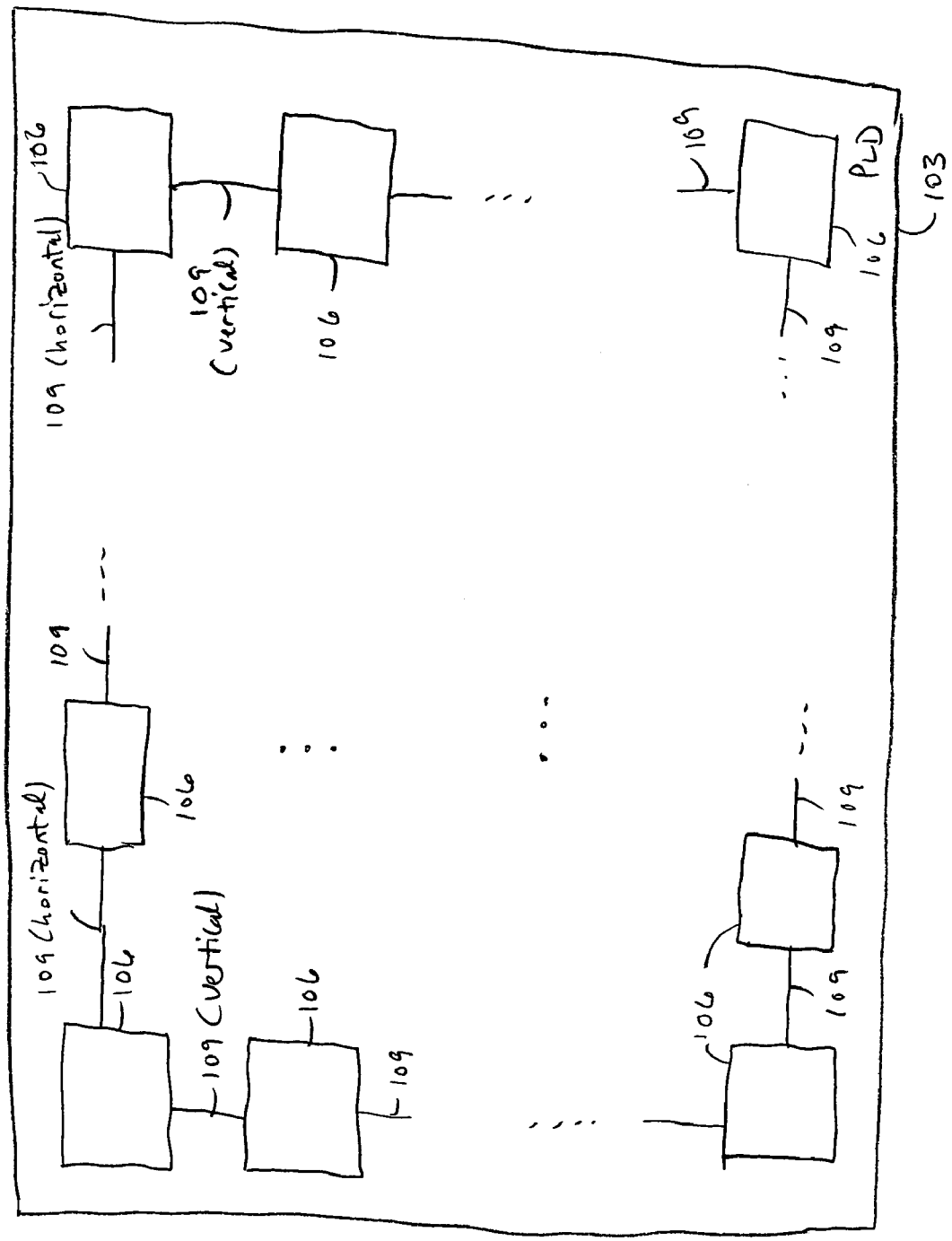
FIG. 2 illustrates a floor-plan of a PLD according to an exemplary embodiment of the invention.

FIG. 2 shows a floor-plan of a PLD 103 according to an exemplary embodiment of the invention. PLD 103 includes programmable logic 106 arranged as a two-dimensional array. Programmable interconnect 109, arranged as horizontal interconnect and vertical interconnect, couples the blocks of programmable logic 106 to one another. One may adjust the power supply voltage and/or body bias of the transistors and various blocks or regions in PLD 103 (either by applying different body bias values over time, or applying a set of body bias values to a subset or all of regions, blocks, etc.), as described below in detail.

In illustrative embodiments, PLDs according to the invention have a hierarchical architecture. In other words, each block of programmable logic 106 may in turn include smaller or more granular programmable logic blocks or circuits. For example, in one embodiment, programmable logic 106 may constitute blocks of configurable logic named logic array block (LAB), and each LAB may include logic elements (LEs) or other circuitry, as desired. Persons of ordinary skill in the art who have the benefit of the description of the invention understand, however, that a wide variety of other arrangements, with varying terminology and topology, are possible, and fall within the scope of the inventive concepts.

Figure 3:
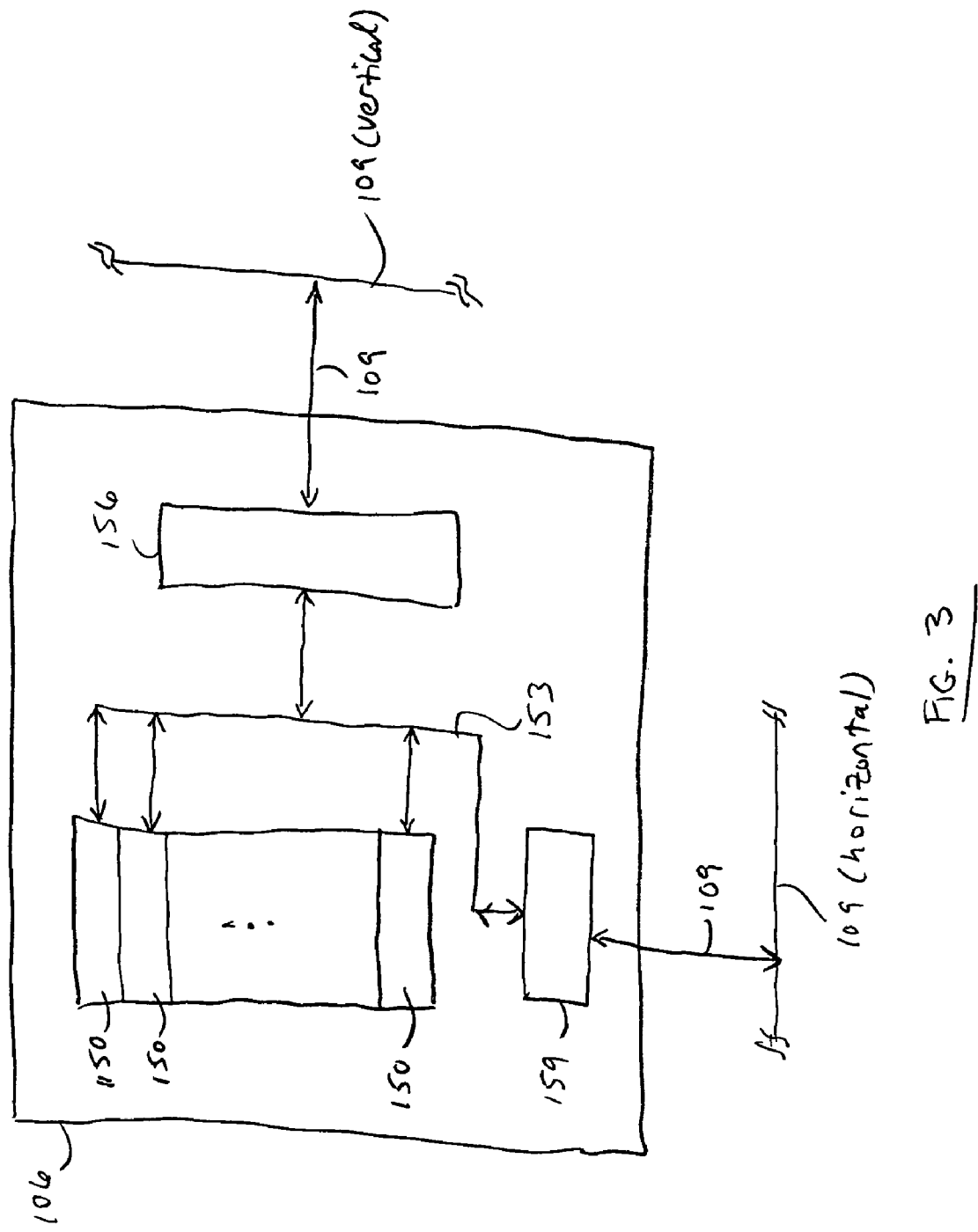
FIG. 3 depicts a block diagram of a portion of programmable logic circuitry in a PLD according to an exemplary embodiment of the invention.

FIG. 3 shows a block diagram of programmable logic 106 in a PLD according to an exemplary embodiment of the invention. Programmable logic 106 includes logic elements or programmable logic circuits 150, local interconnect 253, interface circuit 156, and interface circuit 159. Logic elements 150 provide configurable or programmable logic functions, for example, LUTs, registers, product-term logic, etc., as persons of ordinary skill in the art who have the benefit of the description of the invention understand. Local interconnect 153 provides a configurable or programmable mechanism for logic elements 150 to couple to one another or to programmable interconnect 109 (sometimes called "global interconnect"), as desired.

Interface circuit 156 and interface circuit 159 provide a configurable or programmable way for programmable logic 106 block of circuitry to couple to programmable interconnect 109 (and hence to other programmable logic 106, as FIG. 3 shows). Interface circuit 156 and interface circuit 159 may include MUXs, registers, buffers, drivers, and the like, as persons of ordinary skill in the art who have the benefit of the description of the invention understand.

In exemplary embodiments according to the invention, PLD 103 uses several voltages to supply power and body bias to various regions or circuitry within PLD 103. More specifically, the inventive techniques manage power consumption by using some amount of NVM 142 and CRAM 133 on PLD 103. NVM 142 may store die-specific process-related information, and may controls the values of various voltages, such as body bias voltages or power supply voltages. The particular values of the voltages applied to various regions or circuits may be derived using a combination of information from CRAM 133 and NVM 142 (PLD computer-aided design (CAD) software flow, described below in detail, determines the values to store in CRAM 133).

The values stored in NVM 142 may be determined and programmed before use by the end-user, such as during test time of PLD 103. In this manner, PLD 103 stores values that minimize, manage, or optimize power consumption or dissipation for that particular die, according to one or more configurations that are determined by CRAM 133. PLD CAD software flows facilitate that operation, and are used to assign appropriate voltages to regions or circuits of PLD 103.

Figure 4:
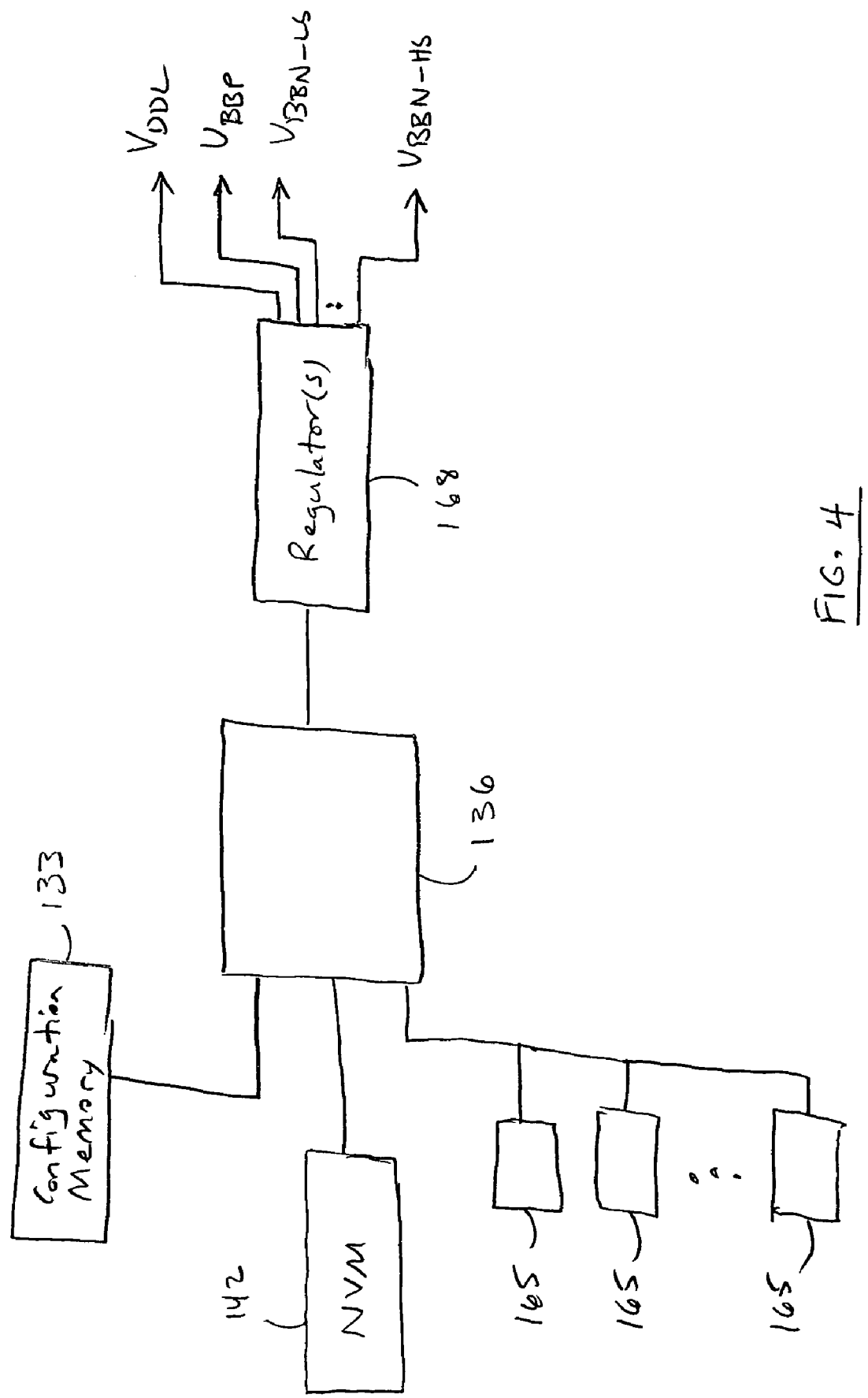
FIGS. 4-7 show simplified block diagrams of circuit arrangements used to manage power dissipation according to an exemplary embodiment of the invention.

FIG. 4 shows a simplified block diagram of a circuit arrangement used to manage power dissipation according to an exemplary embodiment of the invention. The circuit arrangement includes CRAM 133, NVM 142, control circuitry 136, one or more regulators 168, and a desired number of optional I/O pads 165. Note that the circuit arrangement may use a subset (rather than all) of the information stored in CRAM 133 and NVM 142.

Furthermore, as noted above, control circuitry 136 may perform a variety of functions. Accordingly, block 136 in the figure may constitute a part of the circuitry and/or functionality of control circuitry 136 in FIG. 1, as desired, and as persons of ordinary skill in the art who have the benefit of the description of the invention understand. One may implement NVM 142 in a variety of ways, as desired, and as persons of ordinary skill in the art who have the benefit of the description of the invention understand. For example, one may use fuses, flash memory, and the like.

Control circuitry 136 includes logic circuitry that receives its inputs from CRAM 133 and NVM 142, and provides a set of outputs to regulator(s) 168. Regulator(s) 168 use the information provided by control circuitry 136 to generate voltages that affect the speed or delay of the chip. As persons of ordinary skill in the art who have the benefit of the description of the invention understand, regulator(s) 168 may reside either on-chip or off-chip, as desired. The choice of implementation depends on a number of factors, such as design and performance specifications, as persons of ordinary skill in the art who have the benefit of the description of the invention appreciate.

Furthermore, additional logic circuitry or I/O pads 165 may be used to provide communicate between the voltage selection circuitry in control circuitry 136 and voltage regulator(s) 168, as desired. Examples may include interfaces that communicate using standard or other protocols, for instance to send encoded voltage value(s) to external voltage regulator (s), as desired. Other variations fall within knowledge of persons of ordinary skill in the art who have the benefit of the description of the invention.

In the example shown, the voltages are $V_{DDL}$, $V_{BBP}$, $V_{BBN\_LS}$, and $V_{BBN\_HS}$. Note, however, that one may generate any appropriate or desired number of supply and/or body bias voltages, as desired, and as persons of ordinary skill in the art who have the benefit of the description of the invention understand. Note that one may apply different body bias voltages over time, as desired. Also, one may apply a set of body bias values, for example, one body bias value to a portion or all of a region or set of regions, circuits, or blocks, and another body bias value to a portion or all of a region or set of regions, blocks, or circuits, and so on, as desired.

Voltage $V_{DDL}$ is used to generate or provide the supply voltage, $V_{DD}$, for some circuits on the chip. Note that, rather than generating one supply voltage, regulator(s) 168 may generate any desired number of supply voltages. One may then use an appropriate set of supply voltages (or supply voltage) to provide power to a given circuit or block in PLD 103, so as to manage its power consumption (and speed of operation).

Voltages $V_{BBP}$, $V_{BBN\_LS}$, and $V_{BBN\_HS}$ constitute body bias voltages applied to desired circuits, devices, or blocks within PLD 103. In the example shown, voltage $V_{BBP}$ is used for the N-well bias of some or all of the PLD's PMOS transistors. Further, voltages $V_{BBN\_LS}$ and $V_{BBN\_HS}$ are used for the P-well bias of some or all of the PLD's NMOS transistors.

Various regions, devices, or circuits on the chip may configurably select between the $V_{BBN\_LS}$ and $V_{BBN\_HS}$ voltages. Such voltages may be used as configurable body bias voltages, for use, for example, as described in U.S. patent application Ser. No. 10/865,402, titled "Apparatus and Methods for Adjusting Performance of Integrated circuit," filed on Jun. 10, 2004. Using $V_{BBN\_LS}$ results in relatively low speed (LS) operation (but with relatively lower power consumption), while using $V_{BBN\_HS}$ results in relatively high speed (HS) operation (but with relatively higher power consumption). The choice of the body bias voltage depends on various factors, such as desired performance, desired power consumption, or a trade-off between the two, as persons of ordinary skill in the art who have the benefit of the description of the invention understand.

One may optionally use I/O pads 165 or test pads that couple to control circuitry 136. I/O pads 165 may be used to force one or more of the voltages to specific or desired values during testing of the PLD's die. In addition, or instead, one may use combining functions that consider the information received from CRAM 133, NVM 142, and I/O pads 165 in determining the voltages provided by various parts of PLD 103. For example, I/O pads 165 may be used to select between one of multiple voltages provided to PLD 103 to dynamically adjust the voltages, as desired.

Initialization circuitry 139 (not shown explicitly, but shown in FIG. 1) may also be used to power up PLD 103 in a known mode, with a corresponding level of voltages and, hence, power consumption. Some of programmable logic 106 may also be used as part of control circuitry 136, as desired. For example, part of the circuit that receives and processes information from I/O pads 165 may be implemented using programmable logic 106. In addition, one may use a wide variety of other arrangements, as persons of ordinary skill in the art who have the benefit of the description of the invention understand.

Figure 5:
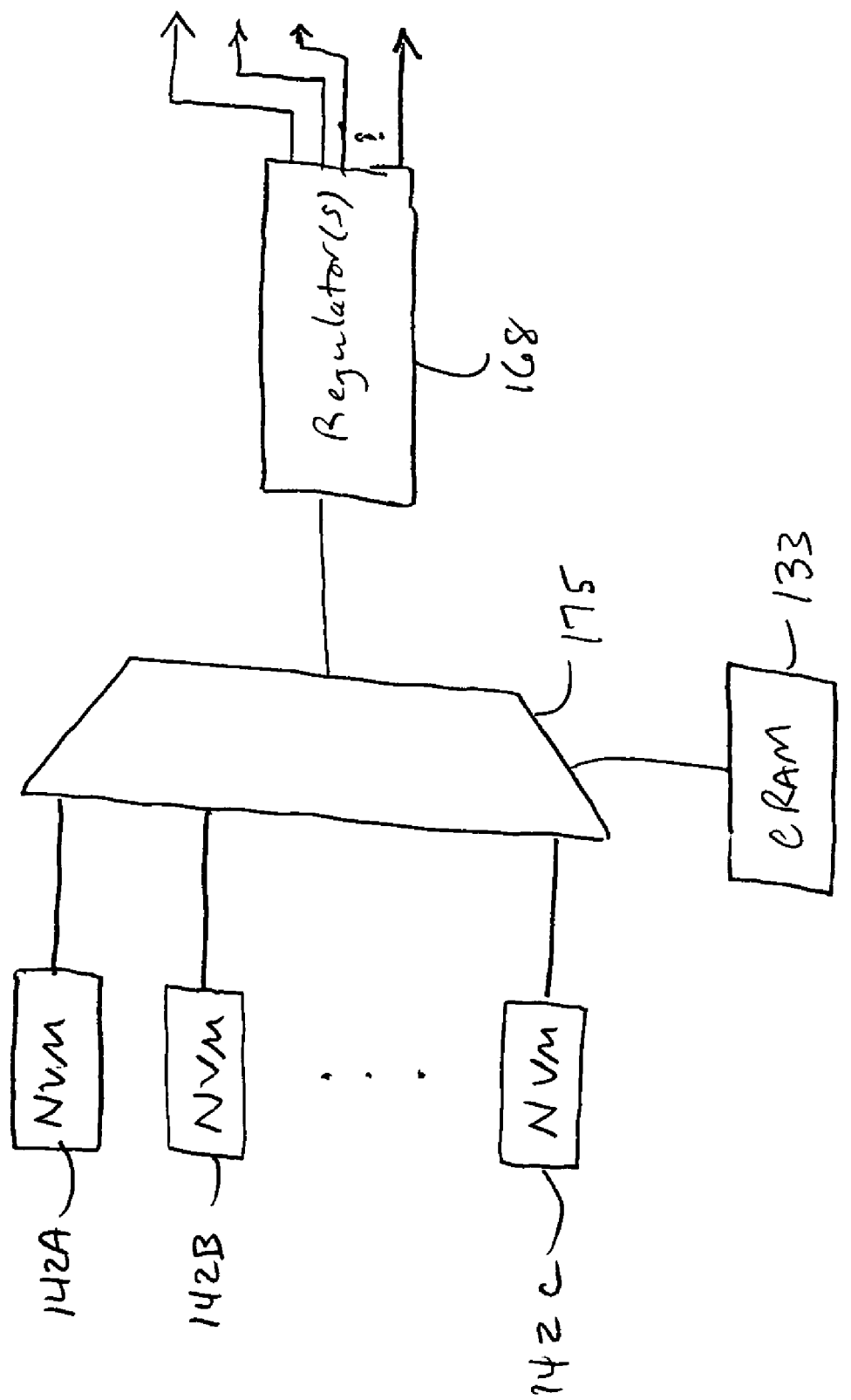

FIG. 5 shows a simplified block diagram of a circuit arrangement used to manage power dissipation according to another exemplary embodiment of the invention. The circuit arrangement includes NVM 142A-142C, MUX 175, CRAM 133, and regulator(s) 168. The NVM is structured, at least in part, as a set of NVM cells or elements 142A-142C. NVM elements 142A-142C represent settings or values that determine the corresponding voltages for a particular configuration. In the example shown, a voltage setting for each of the supply voltage(s) and body bias voltage(s) is chosen based on the desired or intended usage of PLD 103.

In the embodiment shown, MUX 175 selects a particular set of NVM cells or values, depending on the contents of CRAM 133. More specifically, CRAM 133 provides selection signal(s) to MUX 175 which, in response, selects desired values as represented and provided by NVM elements 142A-142C.

This aspect of the invention may be used to provide for optimal power settings in a variety of specific configurations. For example, a PLD may be used in one of multiple speed grades, say, grades 3 and 4. A given die, however, may be sold as either a grade 3 or grade 4 die, provided that it meets the specifications of the corresponding speed grade. NVM 142 may store the voltage settings that optimize power while meeting timing specifications in NVM elements 142A-142C. Thus, each of NVM elements 142A-142C may store values that correspond to appropriate voltage levels for each desired or possible grade.

In another embodiment, NVM 142 may provide separate settings or values based on the optimal speed balance between high speed and low speed PLD regions. A particular user's circuit may have its power optimized using a specific speed for the low speed regions (and/or high speed regions). In this embodiment, a number of distinct speed settings for the high speed and low speed regions are encoded in NVM 142. PLD CAD software can choose among the settings that optimize power for a given design or performance target or specification.

As one example, it might be desirable to set $V_{BBN\_HS}$ to meet the timing specifications for a particular speed grade, but to adjust $V_{BBN\_LS}$ to a specific value that makes the speed of the low speed regions 10% or 20% (or other desired values) slower than the high speed regions. Some NVM elements (say, 142A and 142B) would encode values that cause provision of appropriate voltages that result in the specific speeds to be met by the low speed regions. The PLD CAD software can then choose between a 10% and 20% (or other desired values) slow down for the low speed region, and determine which setting minimizes or reduces power consumption.

In another embodiment, multiple speed settings beyond the speed grades provided may be encoded in CRAM 133. As one example, extra CRAM cells or elements may encode a slow down of 5%, 10%, 15% or 20% (or other desired values) beyond the speed grade of the device. Using this technique, one may optimize or manage power consumption of PLD 103 in a flexible manner.

Figure 6:
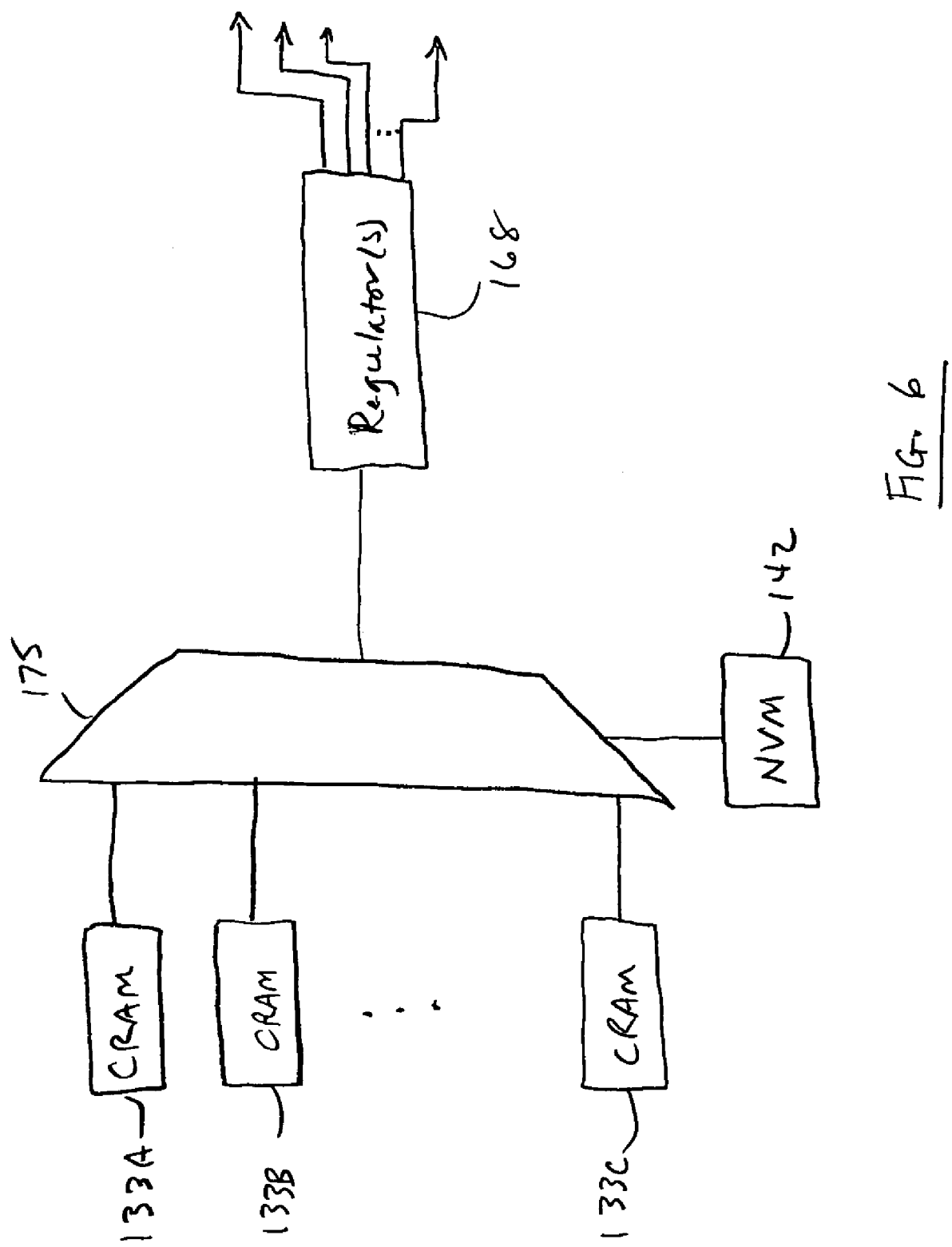

Other exemplary embodiments, in which the data inputs to MUX 175 are CRAM cells or elements, and NVM 142 selects from among the various values represented by CRAM elements, are also possible, as desired. FIG. 6 illustrates such an embodiment. An appropriate number of cells or elements of NVM 142 would encode aspects of the process variation, and the CRAM cells or elements 133A-133C would encode values that correspond to the voltages to be used at that particular point in the process variation. Put another way, in such embodiments, the roles of CRAM elements and NVM elements are switched (compared to the embodiment in FIG. 5).

Figure 7:
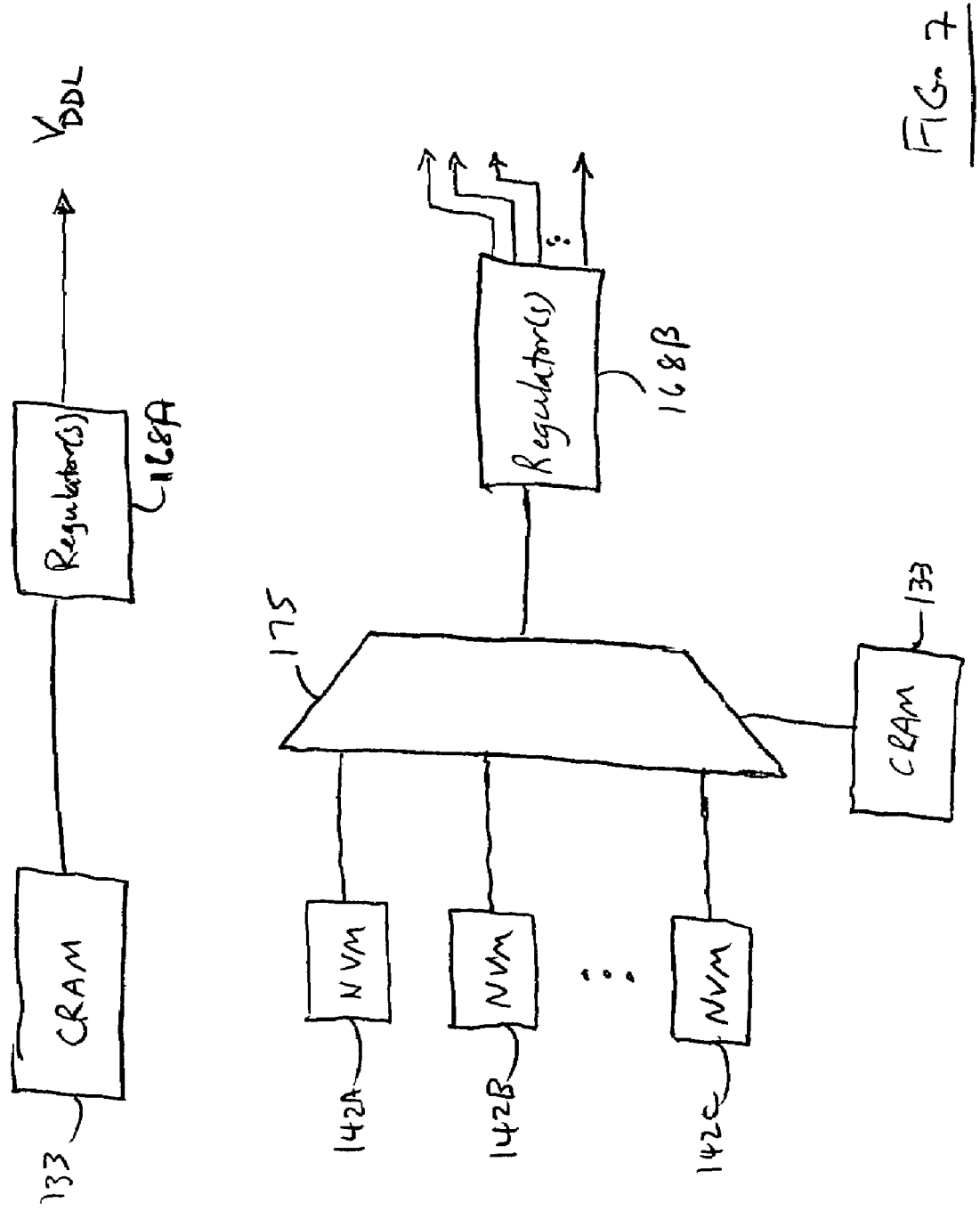

In other embodiments, one may partition the control and generation of desired voltages. FIG. 7 shows an exemplary embodiment that uses this technique. In the example shown, NVM elements encode values corresponding to body bias voltages for the corresponding speed grade and relative speed of the high speed and low speed regions. CRAM 133 separately encodes values used to produce the supply voltage(s) that produce an additional slow down compared to the nominal value of the speed grade.

More specifically, CRAM 133 provides values to regulator 168A that use those values to generate one or more supply voltages (or generate voltages used to generate appropriate or desired supply voltages). Other cells or elements of CRAM 133 act as select signals so as to provide values encoded in NVM cells or elements 142A-142C as outputs of MUX 175. In other embodiments, one may reverse the roles of CRAM 133 and NVM 142, as desired (see FIG. 6).

Using the various embodiments, one may provide a mechanism to manage PLD power consumption while meeting the user's speed or timing constraints. Note that one may use I/O pads 165 to provide additional types of control or to take into account other parameters, as desired.

Generally speaking, one may use appropriately determined values of body bias voltages in order to optimize the power consumption of the PLD circuitry while meeting delay or speed specifications. Such body bias voltages can minimize power consumption while meeting specific or desired values of timing. One may use I/O pads 165 (see FIG. 4) to apply various voltages or patterns to the control circuit. The circuit is configured to a known state, and as each voltage pattern is applied, the power consumption and delay of the circuit is measured.

In the case of a PLD, the known state of the PLD should reflect the usage of the PLD for which one desires to minimize power consumption, and may represent a typical or worst case user circuit, as desired. A specific voltage combination may be selected which minimizes power consumption, and NVM 142 is programmed to encode this combination. This sequence may be repeated multiple times to provide the NVM settings for each of the CRAM-addressable settings.

In another embodiment, on-chip circuits or test circuits (possibly including specific test circuits) are provided to measure delay and possibly power consumption. This approach may avoid measuring total die power consumption during testing. For example, a set of test circuits may be provided that allow effective measurement of process variation at a single voltage or several voltages can be used. Such circuits may include logic circuits of various P-type to N-type transistor width ratios, various transistor lengths and widths, and transistors with various threshold voltages and layout structures.

A relatively small number of test voltage patterns can be designed and used such that measuring the delay of the test structures at a relatively limited number of voltage levels can provide sufficient information about the process point in order to determine the optimal voltages. As one example, one might provide a chain of inverters (say, 4 inverters) with all combinations of P-type to N-type transistor width ratios of 4/1 and 1/1, and lengths of 0.1 micron and 0.2 micron. The particular circuits are chosen to provide an ability to measure the difference in P-type and N-type transistor behavior, and length variation, with a reasonable degree of independence in the measurements.

In general, one may advantageously use a set of test circuits that measure aspects of device performance in a variety of ways, with a tradeoff between the number of measurements and the optimality of managing the power consumption. In a PLD, programmable logic 106 and programmable interconnect 109 may be used for some or all of the test circuits, as desired.

The test measurements might be performed at various body bias voltages for each circuit arrangement (e.g., inverter chain). By performing a statistical analysis on the correlation of the measurements so obtained to the optimal voltages, a model to predict the values encoded in NVM 142 may be used. For example, one might measure the delay of inverter chain 1 at $V_{BBN}$=−0.3V, $V_{BBP}$=0.5V, and inverter chain 2 at $V_{BBN}$=0V, $V_{BBP}$=0.8V, etc. The delay of a given chain might be measured at more than one value of body bias and/or supply voltages, as desired. The determination of a suitable set of measurements may be made by choosing a set of measurements that span the range of electrical properties and control voltage settings that affect performance and power consumption, evaluating their effectiveness, and modifying the set of values as desired until satisfactory, desired, or acceptable results are achieved. Persons of ordinary skill in the art who have the benefit of the description of the invention understand that, in the presence of noise in the case of including on-die variation, a set of measurements should be constructed to be as orthogonal as possible, so that the underlying variables can be determined with as small amount of error as practical.

Figure 8:
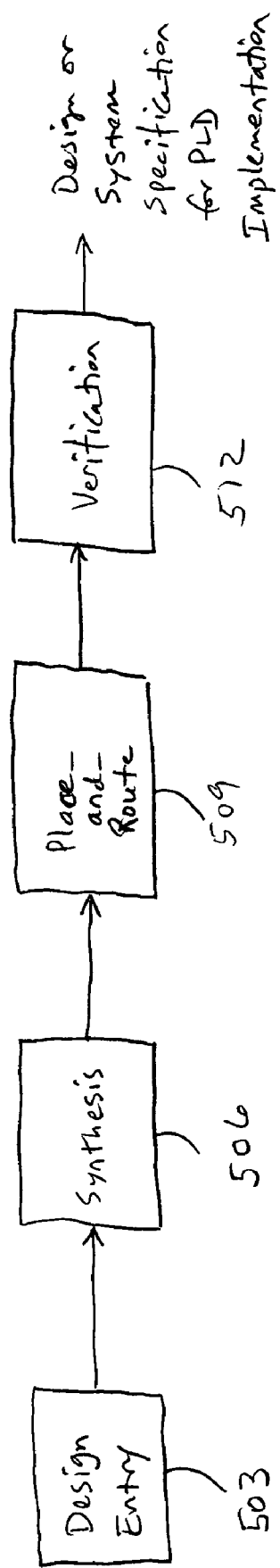
FIG. 8 illustrates a simplified diagram of various software modules or blocks that PLD CAD software according to illustrative embodiments of the invention uses.

As noted, various aspects of the inventive concepts relate to methods used or included in connection with PLD CAD software. FIG. 8 illustrates a simplified diagram of various software modules or blocks that PLD CAD software according to illustrative embodiments of the invention uses. They include design-entry module 503, synthesis module 506, place-and-route module 509, and verification module 512. The following description provides a simplified explanation of the operation of each module, followed by a description of methods relating to various aspects of power management according to the invention.

Design-entry module 503 allows the editing of various design description files using graphical or textual descriptions of a circuit or its behavior, such as schematics, hardware description languages (HDL), or waveforms, as desired. The user may generate the design files by using design-entry module 503 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 506 accepts the output of design-entry module 503. Based on the user-provided design, synthesis module 506 generates appropriate logic circuitry that realizes the user-provided design. One or more PLDs (not shown explicitly) implement the synthesized overall design or system. Synthesis module 506 may also generate any glue logic that allows integration and proper operation and interfacing of various modules in the user's designs. For example, synthesis module 506 provides appropriate hardware so that an output of one block properly interfaces with an input of another block. Synthesis module 506 may provide appropriate hardware so as to meet the specifications of each of the modules in the overall design or system.

Furthermore, synthesis module 506 may include algorithms and routines for optimizing the synthesized design. Through optimization, synthesis module 506 seeks to more efficiently use the resources of the one or more PLDs that implement the overall design or system. Synthesis module 506 provides its output to place-and-route module 509.

Place-and-route module 509 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 509 helps optimize the performance of the overall design or system. By proper use of PLD routing resources, place-and-route module 509 helps to meet the critical timing paths of the overall design or system.

Place-and-route module 509 optimizes the critical timing paths to help provide timing closure faster in a manner known to persons of ordinary skill in the art with the benefit of the description of the invention. As a result, the overall design or system can achieve faster performance (i.e., operate at a higher clock rate or have higher throughput). Place-and-route module 509 may use information about critical paths within the design or system to adjust power consumption of parts or all of the design or system, as desired.

Verification module 512 performs simulation and verification of the design. The simulation and verification seek in part to verify that the design complies with the user's prescribed specifications. The simulation and verification also aim at detecting and correcting any design problems before prototyping the design. Thus, verification module 512 helps the user to reduce the overall cost and time-to-market of the overall design or system.

Verification module 512 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand. Verification of the design may also be performed at other phases in the flow, as appropriate, and as desired.

Figure 9:
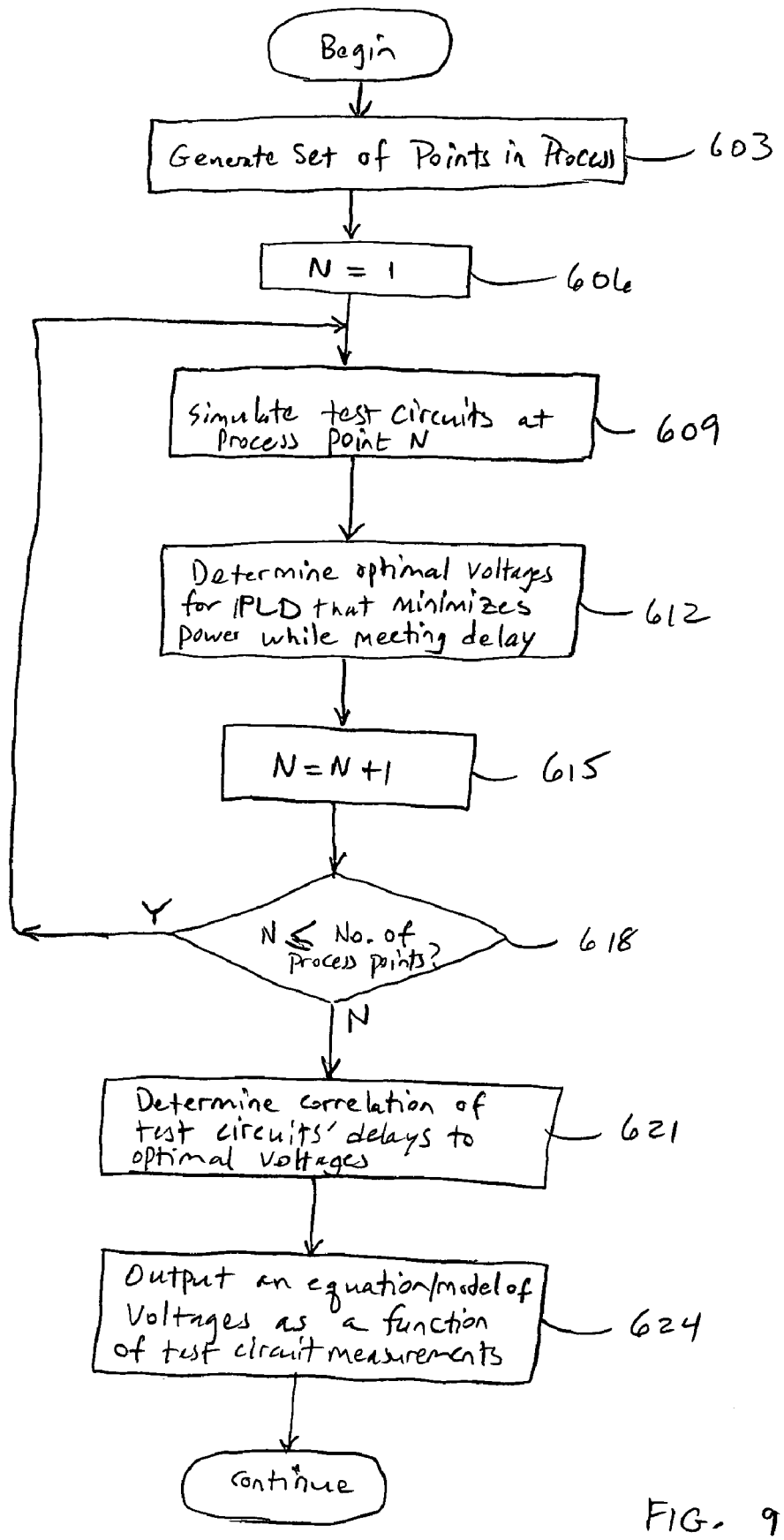
FIG. 9 depicts a flow diagram for a method of generating a model used to program non-volatile memory or storage according to an exemplary embodiment of the invention.

One aspect of the inventive concepts relates to methods of generating a model for programming or encoding the values in NVM 142, given a specific set of measurements. FIG. 9 shows a flow diagram of a method of accomplishing that task. At 603, a set of values representing a possible process variation is generated. Subsequently, in a loop (using a loop counter, N, initialized at 606), each process point is evaluated twice.

The first evaluation, at 609, includes simulating (using a simulator such as SPICE, well known to persons of ordinary skill in the art) the electrical measurements that will be made of the test circuits. The second evaluation determines, either by exhaustive simulations or a combination of simulations and analytical modeling, the optimal voltages to be applied to the PLD for the specific process point. Using a simulation based approach, each test circuit is simulated at the proposed measurement condition to determine the measurement value (power consumption or delay, as appropriate). Using an analytical model based approach, each test circuit has its measurement predicted using a previously generated model that predicts the measurement values at any given process variation.

At 615, the loop counter is incremented, and at 618 a determination is made whether the loop should exit or continue (i.e., whether any additional process points remain). After completion of the loop, at 621, the set of data giving the measurements and optimal voltages are used as input to generate a model giving the voltages as a function of the measurements.

That task may be accomplished by any number of model optimizations, such as generating a linear model or polynomial of some order that minimizes the prediction error. A typical method would be to generate a least squares fit to a polynomial of some predetermined order, although one may use other techniques, as persons of ordinary skill in the art who have the benefit of the description of the invention understand. In general, any mathematical formulation that uses the values of the measured test circuits as independent variables and fits the optimal voltages to these variables can be used as a model, as desired.

At 624, an output for the method is generated. The output is the model, for example, an equation, such that taking the specified set of measurements on the die may be input to the model to produce the specific values to be programmed or encoded into NVM 142.

Note that, instead of simulating the die, it is possible to directly measure the power consumption and delay of a set of dies. Doing so entails total die power consumption measurements, which might be complex and time consuming, and not practical in production. One may therefore opt for die measurement on a relatively limited number of dies to generate the model, as desired. Programming NVM 142 in a production environment would use the limited number of test measurements and the previously generated model.

Note that the above method assumes that the optimal voltage settings are known for each process variation on a particular die. One normally would generate that information before the model generation described above takes place. A model, providing optimal voltage settings as a function of process variation, may be generated by modeling a set of possible process variations. At each process variation, a speed/power consumption measurement is made across various voltage settings. The measurement may be made either by simulation or measurement of an actual die, as desired.

Figure 10B:
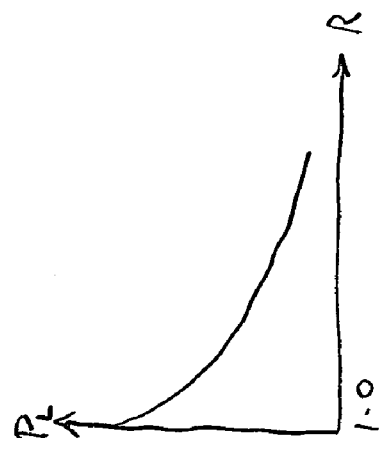
FIGS. 10A-10D show graphs of various quantities as a function of circuit region speeds in exemplary embodiments of the invention.
Figure 10D:
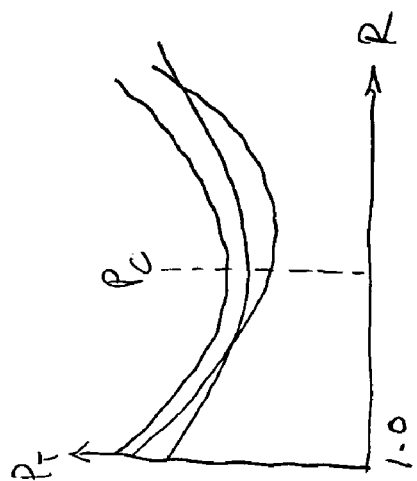
Figure 10A:
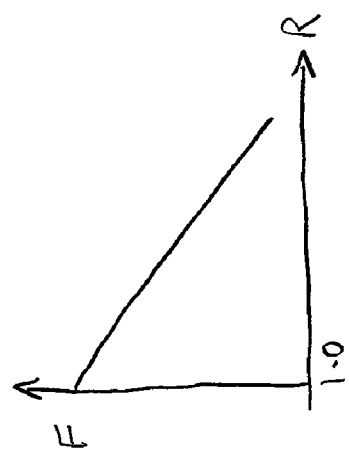

The number of high speed (HS) and low speed (LS) regions can be determined as a function of the speed of LS regions using a method such as described below. FIG. 10A shows a graph of the fraction, F, of PLD regions that constitute LS regions. The fraction is shown as a function of R, the ratio of the delay of LS regions to the delay of HS regions. At the left edge of the plot (i.e., R=1), the LS region delay is the same as the HS region delay, so all regions can be LS. As the delay of the LS region increases, however, not as many regions can be converted to LS (as described below) without violating timing constraints.

Figure 10C:
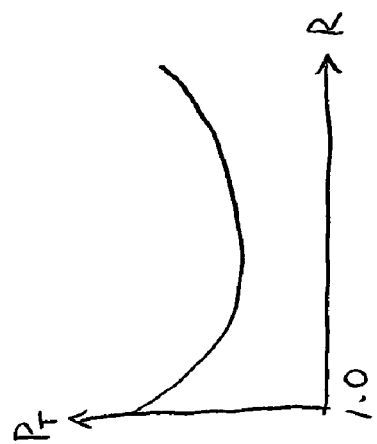

The power consumption for an optimal voltage setting that achieves a delay of HS region that is sufficient to meet timing, and an LS region that is some given amount slower than an HS region can be determined by simulation or measurement. FIG. 10B shows a graph of the power consumption of LS regions as a function of the ratio R. One may combine two values, fraction of regions that are LS regions, and the power consumption of LS regions to determine overall power consumption as a function of the ratio R. FIG. 10C shows a plot of total power.

One may repeat this process across each of the process variations described above. Doing so generates a number of curves for total power consumption. FIG. 10D shows a plot of a family of total power consumption curves generates using this technique. Each curve corresponds to a particular possible process variation. One may then select a low speed region delay that minimizes power consumption. The power consumption may constitute worst case power consumption, average power consumption, or may be according to some other metric, as desired. The example shown in FIG. 10D illustrates the LS region delay that minimizes the worst case power, $P_C$, across all of the process variations encountered.

One aspect of the invention relates to techniques for programming or encoding NVM 142 on each PLD as it is tested in order to optimize power consumption for that. In one embodiment, the PLD is configured sequentially in a number of configurations. The configurations may represent various mixes of HS and LS circuits or blocks in programmable logic 106 (e.g., LABs) and provide circuits that allow the delay of the HS and LS blocks to be measured. For example, one configuration may represent a proportion of 10% high speed LABs and 90% low speed LABs, and the constraint that the low speed LABs are no more than 10% slower than the high speed LABs. Another configuration might be 20% high speed LABs and 80% low speed LABs, and allow 15% slow down for the low speed LABs.

The total power consumption of the die is also measured. Combinations of the voltages (supply and body bias) will be applied and the power consumption and delay are measured at each voltage combination. At the end of the process, the set of voltages correspond to the lowest power consumption, such that the timing specifications are met, can be selected. One may then program or encode the corresponding values into NVM 142. Note that multiple timing specifications or constraints may exist and are accommodated, according to the speed grade being evaluated. For example a particular PLD configuration might have a timing specification of 100 ns for speed grade 3 and 120 ns for speed grade 4.

A variety of other embodiments of the inventive concepts are also possible that allow differing levels of complexity, as persons of ordinary skill in the art who have the benefit of the description of the invention understand. As an example, in one embodiment, one may avoid measurement of power consumption, and reduce the number of voltage settings by using test circuitry, as described above. After performing model generation once for the process, each chip has a specific set of voltages (supply and body bias) applied and each test circuit is measured at specific voltages. One may then use the model described above to compute the optimal voltages and program or encode them in NVM 142.

As noted above, one aspect of the inventive concepts relates to methods of configuring an PLD to minimize power consumption by using configurable speed regions (configurable assignment of LS and HS regions, and determining which regions should be LS regions, and which HS regions). The inventive concepts contemplate high speed and low speed region assignment techniques, which assign specific speed designations to configurable speed regions of PLD 103. The speed adjustment may be performed using body bias voltage assignment, but is not so limited in scope, as persons of ordinary skill in the art who have the benefit of the description of the invention understand. Generally, one may use any configurable apparatus or techniques for adjusting the speed and power consumption of region of PLD 103, as desired.

Note that the logic regions may be of any size and level of granularity. For example, they may constitute LEs, LABs, groups of LABs, etc., as desired. As another example, they may constitute all of the LEs in a single LAB, or all of the interconnect in a LAB, as desired. Many other variations and combinations exist, as persons of ordinary skill in the art who have the benefit of the description of the invention understand.

Generally speaking, the assignment operates as follows: The design is placed, routed, and timing analyzed as usual, assuming that all regions constitute high speed regions. Thereafter, each region is inspected and tentatively assigned a low speed region designation. The assignment is tentative because the design may not meet speed or timing specifications with that region assignment. A timing analysis is performed again to determine whether the low speed region assignment still meets timing specifications. Note that the timing analysis may be incremental, and may analyze those parts of the design that experience changed timing because of the assignment in order to minimize computation. If the low speed assignment violate timing specifications, then the region is re-assigned as a high speed region.

Figure 11:
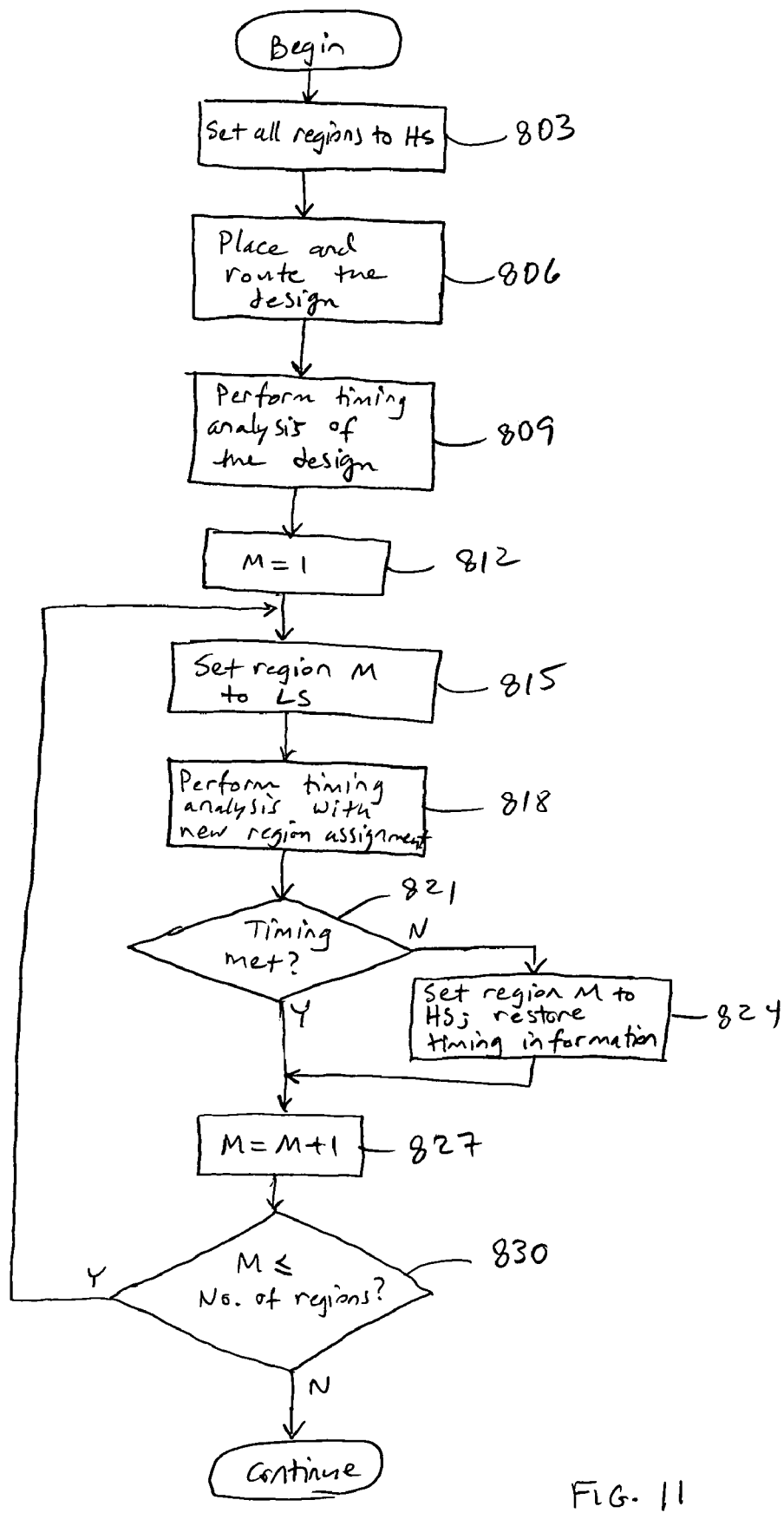
FIG. 11 illustrates a simplified flow diagram for a method according to an exemplary embodiment of the invention for assigning PLD regions.

FIG. 11 shows a simplified flow diagram for a method according to an exemplary embodiment of the invention for assigning PLD regions. At 803, all regions are set or assigned as high speed regions. At 806, the user's design is placed and routed, using CAD software, as described above. At 809, timing analysis of the design is performed, and at 812 loop counter M is initialized. At 815, the region corresponding to the value M is assigned as a low speed region. At 818, timing analysis is performed, taking into account the assignment at 815. At 821, a determination is made whether the design meets timing specifications. If not, the region corresponding to the value M is re-assigned as a high speed region, and the corresponding timing analysis information is restored to reflect the re-assignment.

At 827, loop counter M is incremented, and at 830 a determination is made whether all regions have been processed and assigned, or whether additional regions remain. If additional regions remain, the loop continues and processes those regions.

Many embodiments corresponding to variations of the method described above are possible, as persons of ordinary skill in the art who have the benefit of the description of the invention understand. In one embodiment, the method sorts the regions after timing analysis and examines them in order of increasing criticality or decreasing slack. In this manner, the method may increase the efficiency of computations and reduce the resources used.

As noted, in another embodiment, one may perform region assignments using a fixed, predetermined speed ratio between the high speed and low speed blocks or circuits, e.g., high speed and low speed LABs. For example, low speed LABs may be 10% slower than high speed LABs. The speed difference between high speed and low speed regions is determined in advance by analyzing a set of designs and determining the speed ratio that minimizes power consumption across the set of regions. A corresponding set of supply and body bias voltages are determined, and corresponding values are programmed or encoded in NVM 142.

In another embodiment, one may repeat the method described above (and illustrated as the exemplary embodiment of FIG. 11) with different ratios of the speeds of high and low speed regions. The ratios may correspond to the different voltage settings encoded in NVM 142, for example, the speed grades described above. One may then encode in NVM 142 the setting that results in minimum power consumption is encoded in CRAM 133 (or vice-versa, as FIGS. 5 and 6 illustrate). Note that some of the speed grades may be specified by the user and may be encoded directly in CRAM 133 (or NVM 142), as desired.

In another embodiment, one first determines $V_{DDL}$ such that the high speed regions (e.g., LABs) meet timing specifications. One may do so by using a worst-case voltage-delay tradeoff curve, giving worst case delay as a function of supply voltage for high speed regions. FIG. 12A corresponds to this situation, and shows graphs of various delays as a function of normalized delay, $D_N$. More specifically, FIG. 12A shows graph 903 of normalized delay of programmable logic, graph 906 of normalized delay of programmable interconnect, and graph 912 corresponding to the delay model.

The delay data provide the worst case slow down of any resource of the PLD at a given supply voltage compared to a nominal supply voltage, $V_{DDN}$. One may generate the data using either scale factors (e.g., FIG. 12A), or absolute values, as desired. In other words, the delay of the resources may be represented as a ratio compared to their delay at some nominal voltage, or as absolute delay values across a range of voltages. Using this technique ensures that any path through the device, regardless of the types of resources, will be at least as fast as timing specifications of the critical path dictate (note that at this stage one may assume that all regions are high speed regions because the HS/LS assignment has not been performed, and HS/LS assignment will not affect the worst case delay path).

One may then adjust the speeds of the high speed regions and the individual resource types in the timing model to correspond to the delays under the chosen $V_{DDL}$. Note that $V_{DDL}$ can be determined by any one of various search algorithms, such as binary search or secant method, to determine a voltage at which all resources will fast enough for a particular situation. One may then use the method described above (see, for example, FIG. 11) to perform HS/LS region assignment. Note that in this situation, the method uses the worst case voltage-delay tradeoff during $V_{DDL}$ assignment, and does not take advantage of the particular mix of resources used in a specific user design.

In another embodiment, the high speed and low speed region assignment is performed using the assumption that $V_{DDL}$ is the nominal voltage ($V_{DDN}$). After high speed and low speed region assignment, one may perform a search to determine the best value for $V_{DDL}$, using exact voltage/delay scaling for the various resource types and high speed and low speed circuit blocks (e.g., LABs). The search may constitute any of a number of well known methods, such as secant or binary search, or other types of search, as persons of ordinary skill in the art who have the benefit of the description of the invention understand.

At each voltage to be evaluated, a timing analysis is performed. The lowest voltage that meets timing specifications is then selected and encoded in the parts (e.g., cells or elements) of CRAM 133 that correspond to $V_{DDL}$. Note, however, that in this embodiment, the delay ratio between high speed and low speed regions may not be the same at the chosen $V_{DDL}$ as at the nominal supply voltage, so the choice of high speed and low speed region assignments may not be optimal.

In other embodiments, one may combine the above two approaches. More specifically, a first pass estimate of $V_{DDL}$ is performed using average voltage-delay scaling for a typical mix of resource types, as FIG. 12B shows, or an estimate of the resources used by the particular design of the user. Note that one may use an average voltage-delay scaling because, if timing specifications are not met, $V_{DDL}$ can be further refined later. Thus, if this portion of the method produces a $V_{DDL}$ value that does not result in meeting the timing specifications, one may later adjust the value of $V_{DDL}$ so as to meet the timing specifications (as described below).

Thereafter, one performs high speed and low speed region assignment, using the assumed $V_{DDL}$ value and the associated delay ratio of high and low speed regions and various resource types. In contrast to the fixed delay ratio between low speed and high speed regions (e.g., LABS), the low-speed to high-speed delay ratio will be a function of $V_{DDL}$, but is assumed as a constant once one has chosen a $V_{DDL}$ value. Note that, at this point, one may determine the critical path for the assumed value of $V_{DDL}$ by using a distinct voltage-delay timing model for each unique resource type. A search is then performed to find the $V_{DDL}$ value that meets timing specifications. This approach performs the high speed and low speed region assignment using a timing model based on a $V_{DDL}$ value that is close to the final $V_{DDL}$. Thus, it chooses a more optimal value of $V_{DDL}$ and results in a high speed and low speed region assignment based on that reasonable estimate.

In yet another embodiment, one may iterate the above technique to provide better accuracy. In other embodiments, the $V_{DDL}$ assignment may take place before placement, or after placement but before routing, or at combinations of those points, as desired.

In a simpler embodiment, corresponding to providing a fixed supply voltage chosen at the time that the user's design is designed, the CAD software simply outputs the desired supply voltage ($V_{DDL}$). The user may then use an external source of power that supplies that voltage to PLD 103.

Note that one may apply the inventive concepts effectively to various ICs, including those that include programmable or configurable logic circuitry, which may be known by other names in the art, as desired, and as persons skilled in the art with the benefit of the description of the invention understand. Such circuitry include, for example, devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. A programmable logic device (PLD), comprising:
   a non-volatile memory;
   a configuration memory; and
   a control circuitry coupled to the non-volatile memory and to the configuration memory,
      wherein a set of voltages are derived from outputs of the control circuitry, and
      wherein the set of voltages are applied to circuitry within the programmable logic device (PLD).

2. The programmable logic device (PLD) according to claim 1, wherein the set of voltages includes at least one supply voltage used to supply power to circuitry within the programmable logic device (PLD).

3. The programmable logic device (PLD) according to claim 2, wherein a value of the at least one supply voltage is selected to reduce power consumption of the programmable logic device (PLD), while meeting a set of timing specifications of the programmable logic device (PLD).

4. The programmable logic device (PLD) according to claim 3, wherein the control circuitry comprises a multiplexer (MUX), having at least one select input and a set of inputs.

5. The programmable logic device (PLD) according to claim 4, wherein the at least one select input of the multiplexer couples to the configuration memory, and wherein the set of inputs of the multiplexer couples to the non-volatile memory.

6. The programmable logic device (PLD) according to claim 4, wherein the at least one select input of the multiplexer couples to the non-volatile memory, and wherein the set of inputs of the multiplexer couples to the configuration memory.

7. The programmable logic device (PLD) according to claim 1, wherein the set of voltages includes at least one body bias voltage.

8. The programmable logic device (PLD) according to claim 7, wherein the at least one body bias voltage includes a first body bias voltage provided to P-type transistors within the programmable logic device (PLD).

9. The programmable logic device (PLD) according to claim 8, wherein the at least one body bias voltage includes a second body bias voltage provided to N-type transistors within the programmable logic device (PLD).

10. The programmable logic device (PLD) according to claim 8, wherein the at least one body bias voltage includes second and third body bias voltages, and wherein the second and third body bias voltages can be configurably provided to N-type transistors within the programmable logic device (PLD).

11. The programmable logic device (PLD) according to claim 7, further comprising a set of pads configured to allow setting the at least one body bias voltage to a desired value.

12. The programmable logic device (PLD) according to claim 1, further comprising initialization circuitry configured to allow powering up the programmable logic device in a known mode.

13. The programmable logic device (PLD) according to claim 1, wherein a supply voltage of the programmable logic device is derived from values stored in a first portion of the configuration memory, and wherein at least one body bias voltage applied to the programmable logic device is selected using from values stored in a second portion of the configuration memory.

14. A programmable logic device (PLD), comprising a set of circuits configured to allow measuring delay characteristics of circuitry within the programmable logic device, the set of circuits comprising a set of transistors with varying ratios of a width of a P-type transistor to a width of an N-type transistor, wherein power consumption of the programmable logic device is optimized by using a model derived from the delay characteristics measured using the set of circuits.

15. The programmable logic device (PLD) according to claim 14, wherein using the set of circuits avoids measuring a total power consumption of a die of the programmable logic device (PLD).

16. The programmable logic device (PLD) according to claim 14, wherein the set of circuits comprises a set of transistors with varying width to length ratios.

17. The programmable logic device (PLD) according to claim 14, wherein the set of circuits comprises a set of transistors with varying threshold voltages.

18. The programmable logic device (PLD) according to claim 14, wherein the set of circuits has different body bias voltages applied to it.

19. The programmable logic device (PLD) according to claim 14, wherein the model derived from the delay characteristics is used to encode values in a non-volatile memory.

20. The programmable logic device (PLD) according to claim 19, wherein the values encoded in the non-volatile memory are used to optimize power consumption of the programmable logic device.

21. The programmable logic device (PLD) according to claim 14, wherein the set of circuits comprises test circuits.

22. The programmable logic device (PLD) according to claim 14, wherein the set of circuits comprises at least one of programmable logic or programmable interconnect.

23. The programmable logic device (PLD) according to claim 14, wherein the set of circuits are configured to allow measuring delay characteristics in response to application of set of voltages.

* * * * *